US 8,975,955 B2

(12) United States Patent
Acimovic et al.

(10) Patent No.: US 8,975,955 B2
(45) Date of Patent: Mar. 10, 2015

(54) ANALYSIS OF DOHERTY AMPLIFIERS

(71) Applicants: Igor Acimovic, Gatineau (CA); Brian Racey, Ottawa (CA)

(72) Inventors: Igor Acimovic, Gatineau (CA); Brian Racey, Ottawa (CA)

(73) Assignee: Alcatel Lucent, Boulogne-Billancourt (FR)

( * ) Notice: Subject to any disclaimer, the term of this patent is extended or adjusted under 35 U.S.C. 154(b) by 100 days.

(21) Appl. No.: 13/710,605

(22) Filed: Dec. 11, 2012

(65) Prior Publication Data

US 2014/0159808 A1    Jun. 12, 2014

(51) Int. Cl.
*G01R 27/02* (2006.01)
*G06F 17/50* (2006.01)
*H03F 3/04* (2006.01)
*H03F 3/191* (2006.01)
*H03F 3/21* (2006.01)

(52) U.S. Cl.
CPC ............ *G01R 27/02* (2013.01); *G06F 17/5072* (2013.01); *H03F 3/04* (2013.01); *H03F 3/191* (2013.01); *H03F 3/211* (2013.01)
USPC ................................ 330/2; 330/295; 330/302

(58) Field of Classification Search
CPC .................. H03F 1/3247; H03F 3/211; H03F 2201/3233; H03F 1/34; H03F 3/602; H03F 3/604; H03F 3/72; H03F 1/0288; H03F 3/191; H03F 1/56; H03F 1/565; H03F 2200/372; H03F 2200/222; H03F 3/60; H03G 3/3042
USPC ................................... 330/2, 124 R, 295, 302
See application file for complete search history.

(56) References Cited

U.S. PATENT DOCUMENTS

| 6,262,629 | B1 | 7/2001 | Stengel et al. |
| 6,320,462 | B1 | 11/2001 | Alley |
| 6,617,929 | B2 * | 9/2003 | Kim et al. ..................... 330/295 |
| 6,714,071 | B1 | 3/2004 | Page |
| 7,521,995 | B1 * | 4/2009 | Krvavac .................... 330/124 R |

(Continued)

FOREIGN PATENT DOCUMENTS

EP      2159912 A1    3/2010

OTHER PUBLICATIONS

Kim, B., et al., "The Doherty Power Amplifier," Micorwave Magazine, IEEE, vol. 7, No. 5, Oct. 2006, pp. 42-50.

(Continued)

*Primary Examiner* — Khanh V Nguyen
(74) *Attorney, Agent, or Firm* — Mendelsohn, Drucker & Dunleavy, P.C.; Steve Mendelsohn

(57) ABSTRACT

An analysis technique for (Doherty) amplifiers having a main amplifier branch and at least one peak amplifier branch. For a given input power level and assumed amplifier impedance levels, an output power level and phase response are obtained for each active device using appropriate load-pull data based on the impedance levels. The performance of the amplifier is analyzed based on the impedance levels, output power levels, and phase responses to generate updated impedance levels. The analysis is repeated until the updated impedance levels converge on steady state values. The analysis can be repeated for different input power levels. Main and peak output matching networks for the amplifier can be designed by iteratively adjusting impedance levels for the networks using appropriate load-pull contours. For the design and analysis phases, the load-pull contours include Class-AB data for the main amplifier device and Class-C data for the peak amplifier device.

20 Claims, 5 Drawing Sheets

(56) References Cited

U.S. PATENT DOCUMENTS

| | | | |
|---|---|---|---|
| 7,714,648 B2* | 5/2010 | Okubo et al. | 330/124 R |
| 8,180,303 B2* | 5/2012 | Dupuy et al. | 455/114.1 |
| 8,188,789 B2 | 5/2012 | Woo et al. | |
| 8,441,326 B1 | 5/2013 | Bromberger | |
| 2010/0315162 A1 | 12/2010 | Gajadharsing et al. | |
| 2012/0126891 A1* | 5/2012 | Kim et al. | 330/124 R |

OTHER PUBLICATIONS

International Search Report and Written Opinion; Mailed Mar. 3, 2014 for corresponding PCT Application No. PCT/CA2013/050927.

Hammi, O., et al., "Design and Performance Analysis of Mismatched Doherty Amplifiers Using an Accurate Load-Pull-Based Model," IEEE Transactions on Microwave Theory and Techniques, vol. 54, No. 8, Aug. 2006, pp. 3246-3254.

Darraji, R., et al., "Generic load-pull-based design methodology for performance optimisation of Doherty amplifiers," IET Science, Measurement and Technology, www.ietdl.org, doi: 10.1049/iet-smt. 2011.0023, 2012, vol. 6, Iss. 3, pp. 132-138.

Colantonio, P., et al., "The Doherty Power Amplifier," International Journal of Microwave and Optical Technology, vol. 5, No. 6, Nov. 2010, pp. 419-430.

Rawat, K., "Load-Pull Assisted CAD Design of Inverted Doherty Amplifier Without Quarter-Wave Transformer," 25th IEEE Canadian Conference on Electrical and Computer Engineering (CCECE), 2012, 4 pages.

* cited by examiner

100

500

170

ANALYSIS OF DOHERTY AMPLIFIERS

BACKGROUND

1. Field

The present invention relates to electronics and, more specifically but not exclusively, to Doherty amplifiers.

2. Description of the Related Art

This section introduces aspects that may help facilitate a better understanding of the invention(s). Accordingly, the statements of this section are to be read in this light and are not to be understood as admissions about what is in the prior art or what is not in the prior art.

A Doherty amplifier has a main amplifier branch and one or more peak amplifier branches that are designed to enable the amplifier to provide high-power amplification by supplementing the amplification provided by the main branch during peak power operations. During normal power operations, the peak branches may be disabled such that high-efficiency amplification is provided by only the main branch. Doherty amplifiers are used in high-capacity wireless systems having modulated signals that exhibit high peak-to-average power ratios.

Certain conventional design practices for Doherty amplifiers rely on Class-AB load-pull data and/or non-linear models in circuit simulators to characterize active devices. The design process is mainly based on manual calculations derived from Doherty design principles and limited load-pull data. Designers make many assumptions such as what input power split to use, which impedance modulation ratio to use, and which gain and compression values to use for each device. Such assumptions might not be accurate and may cause large discrepancies between expected and achieved performance characteristics of the resulting Doherty amplifier, leading to missed milestone deadlines and lower performance capabilities of the amplifier. The deviations from the desired performance are discovered only after the first prototypes are built and tested, at which point it is usually too late to make major changes to fix problems caused by faulty assumptions. Deviations that can be fixed involve manual tuning on the bench, which is a costly, time-consuming, and laborious process with no guarantees of success. Since the tuning is done on a small sample of prototypes, there is no guarantee that the solution will be optimal for large-scale production.

BRIEF DESCRIPTION OF THE DRAWINGS

Other aspects, features, and benefits of various embodiments of the invention will become more fully apparent, by way of example, from the following detailed description and the accompanying drawings, in which.

DETAILED DESCRIPTION

Two-Way Doherty Amplifier

Figure 1:
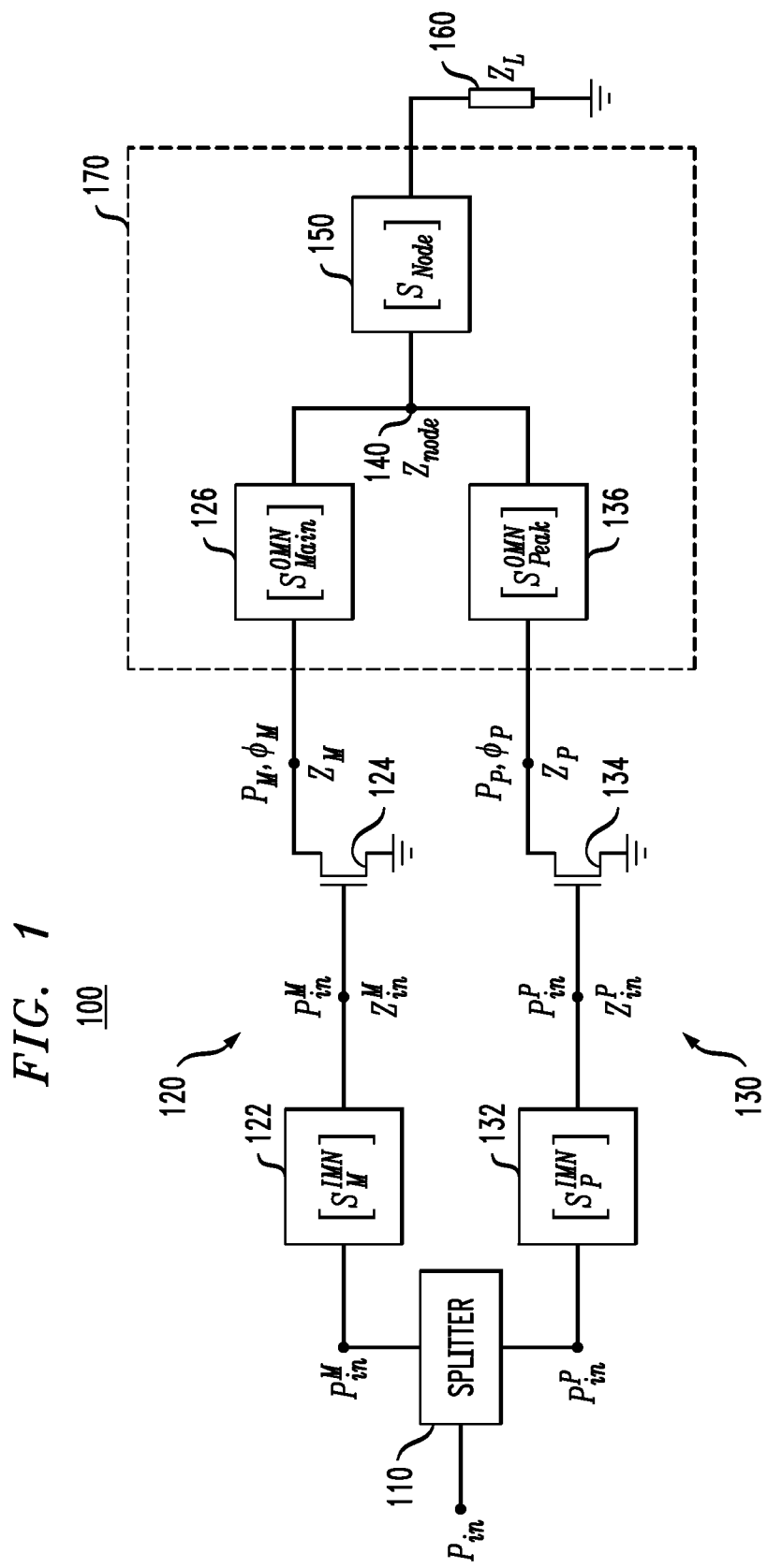
FIG. 1 shows a block diagram of a fixed-input-conditioning, power-split, two-way Doherty amplifier having a main amplifier branch and a peak amplifier branch.

FIG. 1 shows a block diagram of a fixed-input-conditioning, power-split, two-way Doherty amplifier 100 having a main amplifier branch 120 and a peak amplifier branch 130. Input conditioning refers to the control over amplitude and phase of input signals to each branch of the Doherty amplifier. Fixed input conditioning implies that the amplitude ratio of input signals and their phase relationship are adjusted for one power level at a single frequency, e.g., by means of a hardware RF splitter and an input phase offset line. There is no ability to do any input adjustments over power and frequency range.

Main amplifier branch 120 consists of a cascade of a main input matching network 122, a main amplifier device (e.g., transistor) 124, and a main output matching network 126, while peak amplifier branch 130 consists of a cascade of a peak input matching network 132, a peak amplifier device (e.g., transistor) 134, and a peak output matching network 136. An input signal is applied to an input power splitter 110, which splits the input signal power according to a fixed ratio between the main amplifier branch 120 and the peak amplifier branch 130. Output signals from the main and peak amplifier branches are combined at combining node 140 where branches 120 and 130 meet, and the resulting combined signal is delivered to the output load 160 through node matching network 150.

For low signal power operation, peak amplifier branch 130 is inactive (e.g., this is achieved by biasing peak device 134 in Class-C), such that all amplification is provided by main amplifier branch 120. During high signal power operation, peak amplifier branch 130 is active (e.g., the signal amplitude is large enough to turn on peak amplifier device 134), such that amplification is provided by both main amplifier branch 120 and peak amplifier branch 130. The intended intermittent operation of the peak amplifier device 134 is achieved by operating it as a Class-C amplifier, while main amplifier device 124 functions as a Class-AB amplifier. The goal is to maximize efficiency of operation, which means bias should be minimized wherever possible. To achieve higher efficiency, some of the maximum linearity of operation of Class-A mode is traded off for efficiency by going to Class-AB mode. The tradeoff could be anywhere between Class-A and Class-B. Hence, Class-AB which can vary from very close to Class-A to very close to Class-B. This is a designer's choice.

The transfer function of each of the five matching networks 122, 126, 132, 136, and 150 may be represented by an S matrix that transforms complex incident voltages into complex reflected voltages according to Equation (1) as follows:

$$\begin{bmatrix} V_1^- \\ V_2^- \end{bmatrix} = \begin{bmatrix} S_{11} & S_{12} \\ S_{21} & S_{22} \end{bmatrix} \begin{bmatrix} V_1^+ \\ V_2^+ \end{bmatrix} \quad (1)$$

where $V_1^+$ and $V_2^+$ are the complex voltage waves incident on ports 1 and 2, respectively, $V_1^-$ and $V_2^-$ are the complex voltage waves reflected from ports 1 and 2, respectively, and $S_{ij}$ are the four S-matrix parameters. From these voltages and S-parameters, the relevant impedances can be derived for matching networks 122, 126, 132, 136, and 150, and vice-versa.

Design of a Two-Way Doherty Amplifier

The design of two-way Doherty amplifier 100 of FIG. 1 focuses on three main regions of the architecture: input power splitter 110, main and peak output matching networks 126 and 136, and node matching network 150. The output combining network 170 (consisting of the main, peak, and node matching networks 126, 136, and 150) is designed based on the combining node impedance modulation ratio $N_{comb}$, which is a function of the maximum power delivered by the main and peak branches. The impedance modulation ratios are selected using the high-compression main and peak amplifier device load-pull contours (for example, 3 dB for the main device and 1 dB for the peak device) in order to realize the given specification of maximum output power requirements. The designer will select an appropriate value for the impedance modulation ratio based on power and efficiency specifications. The value is not uniquely determined and could have any value in the range from about 1.5 to about 4; however, values from about 2 to about 3 will have practical application for use with actual devices. Since the main and peak devices operate under different bias conditions, they will have different gains at different power levels.

The input power splitter 110 is designed to provide input power for each device to produce output power levels that will achieve the impedance modulation range for which the node matching network was designed. Because the peak device 134, which is biased in Class-C mode of operation, has a lower gain than the main device 124, and because the impedance modulation ratio may need to be greater than 2 for the amplifier to satisfy the efficiency requirement at an output power level that is backed off from the amplifier's maximum power, the input power splitter 110 generally provides unequal power splitting that steers more input power toward the peak device. The ratio of input peak power $P_{IN}^P$ and input main power $P_{IN}^M$ is determined from (i) the maximum power provided by the main device $P_{OUT}^M$, (ii) the corresponding main device gain $G^M$, (iii) the maximum power provided by the peak device $P_{OUT}^P$, and (iv) the corresponding peak device gain $G^P$, according to Equation (2a) as follows:

$$\frac{P_{IN}^P}{P_{IN}^M} = \frac{\frac{P_{OUT}^P}{G^P}}{\frac{P_{OUT}^M}{G^M}} = \frac{G^M P_{OUT}^P}{G^P P_{OUT}^M}. \quad (2a)$$

To design two-way Doherty amplifier 100 of FIG. 1, (at least) three sets of load-pull contours are used at each frequency of interest. For the main device 124, two sets of constant-compression load-pull contours are used, for example, high-compression (3 dB compression or higher) load-pull contours for selection of high-power impedance and low-compression (circa 1 dB compression) load-pull contours for high-efficiency impedance that are obtained for the main device operating under Class-AB bias conditions.

Each set of constant-compression contours has an impedance that has the highest power and an impedance that has the highest efficiency of all other impedances in the set. A high-compression (3 dB or higher) set is used to select a high-power impedance, and a low-compression (1 dB or so) set is used to select a high-efficiency impedance. The high-efficiency impedance will have a lower power associated with it; whereas, the high-power impedance may have lower efficiency associated with it. 1 dB compression is lower compression than 3 dB. The main device is presented with high-efficiency/low-power impedance until it reaches 1 dB compression; at which point, the peak branch turns on and starts modulating the load impedance of the main branch from the high-efficiency/low-power point toward the high-power impedance point, while increasing the compression of the main device which will eventually end in high-power impedance in 3 dB compression (or higher) contours. For the peak device 134, one set of constant-compression load-pull contours obtained under Class-C bias conditions is used, for example, high-power, 1 dB-compression contours, as well as measurement of the off-state impedance of peak device 134 for average-power operations during which peak device 134 is disabled. Because a Class-C device has lower gain, it will undergo lower compression. For the case of the peak device, 1 dB compression can be considered high compression. The compression is the amount of gain decrease from the maximum level. Since the peak device has lower maximum gain due to its Class-C bias, it cannot be compressed too much before its gain becomes inadequate. Hence, 1 dB compression is considered high for the peak device. P1 dB is the power under 1 dB gain compression. XdB refers to gain compression, and PXdB refers to power delivered under that compression. XdB is used when referring to constant compression contours, and PXdB is used when refereeing to specific power within those contours. These three load-pull contours are obtained by measuring the devices that will be used in the actual amplifier design as the main and peak devices 124 and 134.

Load-pull data is obtained for the devices that will be used in the amplifier design and construction. The devices are measured under the same (or similar) biasing and power conditions under which they are intended to be used. The load-pull data consists of input power sweeps done for each load impedance presented to the device. The load-pull setup consists of a vector signal generator, source impedance transformer (e.g., source tuner+device input fixture), the device under test (e.g., transistor), load impedance transformer (e.g., load tuner+device output fixture), and vector signal receiver. A set of load impedances for the test is selected. Several trial measurements may be needed to determine the optimal set of load impedances. Once the device is biased to obtain desired operating conditions, for every load impedance presented to the device by the load impedance transformer, the input power is swept over a prescribed range, and various performance parameters of the transistor are recorded (e.g., output power, gain, efficiency, AM-PM, insertion phase, drain current, etc.). The measurements have the following nesting:

---

Set bias
    Set frequency
        Set load impedance
            Sweep input power and collect measured data
        Next load impedance
    Next frequency
Next bias

---

The measurements are taken for various biasing conditions (Class-AB, Class-B, Class-C of various depths). The measurements are often done for more than one frequency to get better characterization over frequency. The measured data provides the relationship between input and the output of the active device under various loading conditions, such as those that occur in the Doherty amplifier where two branches interact at the node. The data allows us to calculate the response from the transistor based on the interactions of the branch signals at the combining node which are power dependent. The data obtained at each frequency of interest is used to characterize amplifier performance at that frequency. For each load impedance, the device (keeping the same input power conditions) will have different performance regarding output power, gain, and efficiency. Based on the specification, the designer needs to select impedances that will yield performance sufficient to meet the amplifier specifications. Load-pull data allows the designer to pick an impedance that satisfies the high-power requirement for the main device, an impedance that satisfies the high-efficiency requirement at power back-off for the main device, as well as an impedance that satisfies the high-power requirement for one or more peak devices. In the design synthesis procedure, the load-pull data are plotted in constant-compression contour format to facilitate the visual selection of the impedances. This is similar to topographical maps with constant elevation contours, where it becomes easy to locate mountain peaks or plateaus. In the analysis procedure, the load-pull data are plotted in constant-input-power contour format to facilitate location of new impedances that result from convergence calculations in the passive circuit part of the network (main matching network, peak matching network, node matching network). Once the designer makes the impedance selection based on amplifier specifications and subject to restrictions imposed by the synthesis algorithm (to ensure that the solution can be implemented), the analysis algorithm will calculate the response of the amplifier that results from the designer's selections.

The impedance modulation ratio $N_{comb}$ of output combining network 170 determines the range of impedances $Z_{node} \leq Z_{LM} \leq N_{comb} Z_{node}$ that will load the main output matching network 126, where $Z_{node}$ is the impedance at combining node 140 looking towards node matching network 150, and $Z_{LM}$ is the load impedance of the main branch 120, which varies between $Z_{node}$ and $N_{comb} Z_{node}$ as input power $P_{in}$ varies. The combining-network impedance modulation ratio $N_{comb}$ is defined according to Equation (2b) as follows:

$$N_{comb} = \frac{P_P^M + P_P^P}{P_P^M}, \quad (2b)$$

where $P_P^M$ is the maximum output power of the main device 124 and $P_P^P$ is the maximum output power of the peak device 134. $P_P^M$ comes from the high-compression (3 dB or higher usually) main device load-pull contours, while $P_P^P$ comes from the high-compression (0.3 dB to 1 dB or so) peak device load-pull contours.

The value of the combining-network impedance modulation ratio $N_{comb}$ is affected by the selection of the high-power, main impedance $Z_{MP}$ using the main-device, 3 dB (high-compression) load-pull contours and by the selection of the high-power peak impedance $Z_{PP}$ using the peak-device 1 dB (high-compression) load-pull contours, because the selection of these impedances will change the amount of power delivered by the devices.

In addition, using the main-device 1 dB (low-compression) load-pull contours, the high-efficiency main impedance $Z_{ME}$ is selected to satisfy the efficiency requirement at the power back-off level.

After both impedances $Z_{ME}$ and $Z_{MP}$ are selected using the main-device load-pull contours, the impedance modulation ratio $N_{LP}$ of the main device 124 can be calculated according to Equation (3) as follows:

$$N_{LP} = \frac{1+|\Gamma|}{1-|\Gamma|}, \quad (3)$$

where:

$$|\Gamma| = \left|\frac{\Gamma'_{ME} - \Gamma'_{MP}}{1 - \Gamma_{MP}\Gamma'_{ME}}\right|, \quad (4)$$

where the prime symbol (') represents complex conjugation, and the symbol $\Gamma_{xx}$ represents the voltage reflection coefficient, which is related to the impedance $Z_{xx}$ by Equation (5) as follows:

$$\Gamma_{xx} = \frac{Z_{xx} - Z_0}{Z_{xx} + Z_0}, \quad (5)$$

where $Z_0$ is the system reference impedance (usually 50Ω).

Thus, the voltage reflection coefficient $\Gamma_{MP}$ corresponding to the main-device, high-power impedance $Z_{MP}$ selected using the main-device, 3 dB (high-compression) load-pull contours is given by $$\Gamma_{MP} = \frac{Z_{MP} - Z_0}{Z_{MP} + Z_0}.$$

Similarly, the voltage reflection coefficient $\Gamma_{ME}$ corresponding to the main-device, high-efficiency impedance $Z_{ME}$ selected using the main-device P1 dB (low-compression) load-pull contours is given by $$\Gamma_{ME} = \frac{Z_{ME} - Z_0}{Z_{ME} + Z_0}.$$

The main-device impedance modulation ratio $N_{LP}$ is related to the range of impedances presented to the main device 124 and depends on the choice of the high-power and high-efficiency main-device impedances $Z_{MP}$ and $Z_{ME}$, but is independent from the high-power peak-device impedance $Z_{PP}$.

To design an amplifier that will yield targeted performance, impedances $Z_{MP}$, $Z_{PP}$, and $Z_{ME}$ cannot be selected independently. Rather, the selections of impedances are such that the condition $N_{LP} = N_{comb}$ is satisfied. That is, $$N_{LP} = \frac{1+|\Gamma|}{1-|\Gamma|} = \frac{P_P^M + P_P^P}{P_P^M} = N_{comb} = N.$$

If not, the amplifier will still work, but achieved performance might deviate from the targeted values.

Based on the condition $N_{LP} = N_{comb}$, the S matrices for the matching networks 126, 136, and 150 in the output combining network 170 can be calculated. The S matrices will be calculated for impedance values selected even if the $N_{LP} = N_{comb}$ condition is not satisfied. The designer can see the consequences of this choice by running the analysis part and then decide whether to alter the design or keep it as is. After establishing the input power split ratio, the impedance modulation ratio, and the values of impedances $Z_{MP}$, $Z_{PP}$, and $Z_{ME}$, we can proceed with (i) the design of the input power splitter 110, the main and peak input matching networks 122 and 132, the main and peak output matching networks 126 and 136, and the node matching network 150 and (ii) the determination of the delay compensation for the phase difference between the two branches.

Generic Matching Network

Figure 2:
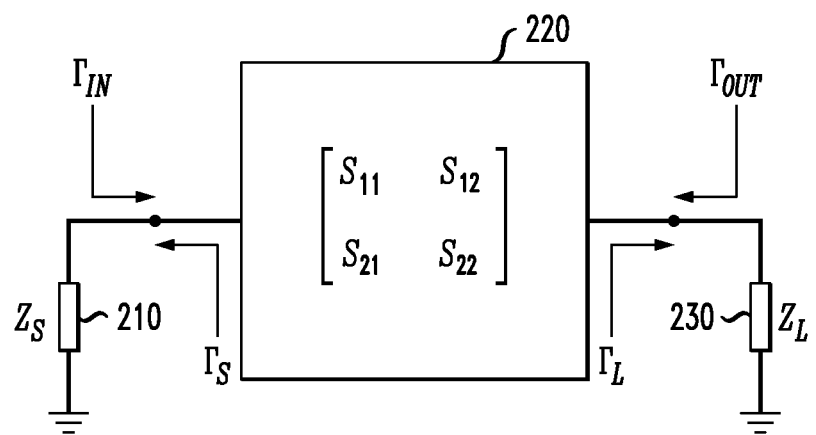
FIG. 2 shows a generic matching network configured between a grounded input load and a grounded output load.

FIG. 2 shows a generic matching network 220 configured between (i) a grounded input load 210 having impedance $Z_S$ and voltage reflection coefficient $\Gamma_S$ and (ii) a grounded output load 230 having impedance $Z_L$ and voltage reflection coefficient $\Gamma_L$. The input and output voltage reflection coefficients $\Gamma_{IN}$ and $\Gamma_{OUT}$ for generic matching network 220 are given by Equations (6) and (7), respectively, as follows:

$$\Gamma_{IN} = S_{11} + \frac{S_{12}S_{21}\Gamma_L}{1 - S_{22}\Gamma_L} \qquad (6)$$

and $$\Gamma_{OUT} = S_{22} + \frac{S_{12}S_{21}\Gamma_S}{1 - S_{11}\Gamma_S}, \qquad (7)$$

where $S_{11}$, $S_{12}$, $S_{21}$, and $S_{22}$ are the parameters of the S matrix for generic matching network 220.

S Matrix for Input Matching Networks and Node Matching Network

Since each of the main and peak input matching networks 122 and 132 and the node matching network 150 converts the system reference impedance $Z_0$ (usually 50Ω) to an arbitrary known impedance, the calculations for these three networks can be done the same way.

Main input matching network 122 converts the output impedance of the main branch of the splitter 110 (usually $Z_0$) to a known source impedance $Z_{SM}$ to be presented to the gate of main device 124. Note that the source impedance $Z_{SM}$ is the impedance looking into main input matching network 122 from the main device 124, whereas the impedance $Z_{in}^M$ of FIG. 1 is the impedance looking into the main device 124 from network 122. This source impedance $Z_{SM}$ is known from the load-pull data, so the impedance conversion of main input matching network 122 is from $Z_0$ to $Z_{SM}$.

Peak input matching network 132 converts the output impedance of the peak branch of the splitter 110 (usually $Z_0$) to a known source impedance $Z_{SP}$ to be presented to the gate of peak device 134. Note that the source impedance $Z_{SP}$ is the impedance looking into peak input matching network 132 from the peak device 134, whereas the impedance $Z_{in}^P$ of FIG. 1 is the impedance looking into the peak device 134 from network 132. This source impedance $Z_{SP}$ is known from the load-pull data, so the impedance conversion of peak input matching network 132 is from $Z_0$ to $Z_{SP}$.

Going in the opposite direction, node matching network 150 converts a known output load impedance $Z_L$ (usually $Z_0$) to a known calculated node impedance $Z_{node}$ at combining node 140.

In essence, the process is the same for all three matching networks; only the target impedance changes ($Z_{SM}$, $Z_{SP}$, and $Z_{node}$). In reference to FIG. 2, the output load impedance $Z_L$ of FIG. 2 always corresponds to $Z_0$ (i.e., splitter output impedances and output load 160 of FIG. 1), and $Z_{IN}$ related to $\Gamma_{IN}$ of FIG. 2 always corresponds to $Z_{SM}$, $Z_{SP}$ at the respective device gate and $Z_{node}$ at combining node 140 of FIG A. Thus, for the main and peak input matching networks 122 and 132, the output load 230 of FIG. 2 corresponds to the upstream, splitter side of the network, while, for the node matching network 150, the output load 230 corresponds to output load 160 of FIG. 1 at the downstream side of the network.

For an output load impedance $Z_L$ equal to the system reference impedance $Z_0$, the load voltage reflection coefficient $\Gamma_L$=0. Substituting $\Gamma_L$=0 into Equation (6) yields Equation (8) as follows:

$$S_{11} = \Gamma_{IN}. \qquad (8)$$

In other words, the parameter $S_{11}$ will be equal to the input voltage reflection coefficient $\Gamma_{IN}$, which is known from the load-pull data.

In the case of complex conjugate match, $\Gamma_S = \Gamma'_{IN}$ and $\Gamma_{OUT}$=0, where the prime (') indicates complex conjugation.

The case of complex conjugate match is the condition that maximizes the power transfer, but other conditions can be used. In those other cases, $\Gamma_S$ and $\Gamma_{OUT}$ will be specified differently but the rest of the calculation is done in the same way with results that will reflect changes in the specification of $\Gamma_S$ and $\Gamma_{OUT}$. Applying the equivalencies $\Gamma_S = \Gamma'_{IN}$ and $\Gamma_{OUT}$=0 to Equation (7) yields Equation (9) as follows:

$$\begin{aligned}\Gamma_{OUT} &= S_{22} + \frac{S_{21}S_{12}\Gamma_S}{1 - S_{11}\Gamma_S} \\ &= S_{22} + \frac{S_{21}S_{12}\Gamma'_{IN}}{1 - \Gamma_{IN}\Gamma'_{IN}} \\ &= S_{22} + \frac{S_{21}S_{12}\Gamma'_{IN}}{1 - |\Gamma_{IN}|^2} \\ &= 0.\end{aligned} \qquad (9)$$

Solving Equation (9) for $S_{22}$ yields Equation (10) as follows:

$$S_{22} = -\frac{S_{21}S_{12}\Gamma'_{IN}}{1 - |\Gamma_{IN}|^2}. \qquad (10)$$

Since the S matrix for a lossless, passive circuit is unitary, $[S']^T = [S]^{-1}$. In other words, the transpose of the complex conjugate of a unitary S matrix will be equal to the inverse of that S matrix. Since the product of an S matrix and its inverse is equal to the identity matrix, multiplying $[S']^T = [S]^{-1}$ from the left by $[S]$ yields Equation (11) as follows:

$$\begin{bmatrix} S_{11} & S_{12} \\ S_{21} & S_{22} \end{bmatrix} \begin{bmatrix} S'_{11} & S'_{21} \\ S'_{12} & S'_{22} \end{bmatrix} = \begin{bmatrix} 1 & 0 \\ 0 & 1 \end{bmatrix}. \qquad (11)$$

Expanding Equation (11) yields Equations (12)-(15) as follows:

$$|S_{11}|^2 + |S_{12}|^2 = 1, \qquad (12)$$

$$S_{11}S'_{21} + S_{12}S'_{22} = 0, \qquad (13)$$

$$S'_{11}S_{21} + S'_{12}S_{22} = 0, \qquad (14)$$

$$|S_{21}|^2 + |S_{22}|^2 = 1. \qquad (16)$$

Since the matching networks are reciprocal, $S_{21} = S_{12}$. Applying this equality and Equations (8) and (12) yields Equation (16) as follows:

$$|S_{21}|^2 = |S_{12}|^2 = |S_{21}S_{12}| = 1 - |S_{11}|^2 = 1 - |\Gamma_{IN}|^2. \qquad (16)$$

Equation (16) implies Equation (17) as follows:

$$S_{21}S_{12} = |S_{21}S_{12}|e^{j\phi} = (1 - |\Gamma_{IN}|^2)e^{j\phi}, \qquad (17)$$

where $\phi$ is the phase of the complex value, which is a function of the network "length," which is related to the phase and time delay of the signals propagating through the network. Higher insertion phase is associated with longer delay. Since $S_{21} = S_{12}$ Equation (17) implies Equation (18) as follows:

$$S_{12} = S_{21} = \sqrt{1 - |\Gamma_{IN}|^2} e^{j\phi/2}. \qquad (18)$$

Substituting Equation (17) into Equation (10) yields Equation (19) as follows:

$$S_{22} = -\frac{S_{21}S_{12}\Gamma'_{IN}}{1-|\Gamma_{IN}|^2} = -\frac{(1-|\Gamma_{IN}|^2)e^{j\phi}\Gamma'_{IN}}{1-|\Gamma_{IN}|^2} = -\Gamma'_{IN}e^{j\phi}. \quad (19)$$

Thus, for each of main input matching network 122, peak input matching network 132, and node matching network 150, the corresponding S matrix parameters $S_{11}$, $S_{12}$, $S_{21}$, and $S_{22}$ are given in terms of the input voltage reflection coefficient $\Gamma_{IN}$ by Equations (8), (18), and (19), where $\Gamma_{IN}$ is known from the load-pull data. The phase $\phi$ is arbitrary. It can be minimized, and it needs to be equalized between the main and peak branches. Also, the phase of the peak branch can be used to ensure that currents from the main and peak branches combine at the combining node 140 in phase.

S Matrix for Main Output Matching Network

The S matrix $S^M$ for the main output matching network 126 is given by Equation (20) as follows:

$$S^M = \begin{bmatrix} S_{11}^M & S_{12}^M \\ S_{21}^M & S_{22}^M \end{bmatrix} \quad (20)$$

During high-power operations, going from the combining node 140 toward the main device 124, the main output matching network 126 converts the high-power main load impedance $Z_{LMP}$ into the high-power main-device impedance $Z_{MP}$. During high-efficiency operations, going from the combining node 140 toward to the main device 124, the main output matching network 126 converts the high-efficiency main load impedance $Z_{LME}$ into the high-efficiency main-device impedance $Z_{ME}$. The main-device impedances $Z_{MP}$ and $Z_{ME}$ are known from the load-pull data selections, the high-power main load impedance $Z_{LMP}$ is user determined (usually $Z_0$), and the high-efficiency main load impedance $Z_{LME} = Z_{LMP}/N_{comb}$.

According to Equation (5), respective voltage reflection coefficients $\Gamma_{LMP}$, $\Gamma_{LME}$, $\Gamma_{MP}$, and $\Gamma_{ME}$ for the four impedances $Z_{LMP}$, $Z_{LME}$, $Z_{MP}$, and $Z_{ME}$ can be calculated by Equations (21)-(24) as follows:

$$\Gamma_{LMP} = \frac{Z_{LMP} - Z_0}{Z_{LMP} + Z_0}, \quad (21)$$

$$\Gamma_{LME} = \frac{Z_{LME} - Z_0}{Z_{LME} + Z_0}, \quad (22)$$

$$\Gamma_{MP} = \frac{Z_{MP} - Z_0}{Z_{MP} + Z_0}, \quad (23)$$

$$\Gamma_{ME} = \frac{Z_{ME} - Z_0}{Z_{ME} + Z_0}. \quad (24)$$

Referring to FIG. 2, for the main output matching network 126, for high-power operations:

$$\Gamma_L = \Gamma_{LMP}, \quad (25)$$

$$\Gamma_S = \Gamma_{MP}, \quad (26)$$

$$\Gamma_{IN} = \Gamma_{MP}, \quad (27)$$

$$\Gamma_{OUT} = \Gamma'_{MLP}. \quad (28)$$

Substituting Equations (25) and (27) into Equation (6) yields Equation (29) as follows:

$$\Gamma_{MP} = S_{11}^M + \frac{S_{12}^M S_{21}^M \Gamma_{LMP}}{1 - S_{22}^M \Gamma_{LMP}}. \quad (29)$$

Similarly, substituting Equations (26) and (28) into Equation (7) yields Equation (30) as follows:

$$\Gamma'_{LMP} = S_{22}^M + \frac{S_{12}^M S_{21}^M \Gamma'_{MP}}{1 - S_{11}^M \Gamma'_{MP}}. \quad (30)$$

Referring to FIG. 2, for the main output matching network 126, for high-efficiency operations:

$$\Gamma_L = \Gamma_{LME}, \quad (31)$$

$$\Gamma_S = \Gamma'_{ME}, \quad (32)$$

$$\Gamma_{IN} = \Gamma_{ME}, \quad (33)$$

$$\Gamma_{OUT} = \Gamma'_{LME}. \quad (34)$$

Substituting Equations (31) and (33) into Equation (6) yields Equation (35) as follows:

$$\Gamma_{ME} = S_{11}^M + \frac{S_{12}^M S_{21}^M \Gamma_{LME}}{1 - S_{22}^M \Gamma_{LME}}. \quad (35)$$

Similarly, substituting Equations (32) and (34) into Equation (7) yields Equation (36) as follows:

$$\Gamma'_{LME} = S_{22}^M + \frac{S_{12}^M S_{21}^M \Gamma'_{ME}}{1 - S_{11}^M \Gamma'_{ME}}. \quad (36)$$

Subtracting Equation (35) from Equation (29) yields Equation (37) as follows:

$$\Gamma_{MP} - \Gamma_{ME} = S_{12}^M S_{21}^M \left( \frac{\Gamma_{LMP}}{1 - S_{22}^M \Gamma_{LMP}} - \frac{\Gamma_{LME}}{1 - S_{22}^M \Gamma_{LME}} \right). \quad (37)$$

Subtracting Equation (36) from Equation (30) yields Equation (38) as follows:

$$\Gamma'_{LMP} - \Gamma'_{LME} = S_{12}^M S_{21}^M \left( \frac{\Gamma'_{MP}}{1 - S_{11}^M \Gamma'_{MP}} - \frac{\Gamma'_{ME}}{1 - S_{11}^M \Gamma'_{ME}} \right). \quad (38)$$

Rearranging Equation (37) yields Equation (39) as follows:

$$S_{12}^M S_{21}^M = \frac{(\Gamma_{MP} - \Gamma_{ME})(1 - S_{22}^M \Gamma_{LMP})(1 - S_{22}^M \Gamma_{LME})}{\Gamma_{LMP} - \Gamma_{LME}}. \quad (39)$$

Substituting Equation (39) into Equation (29) and rearranging yields Equation (40) as follows:

$$S_{11}^M = \Gamma_{MP} - \frac{(\Gamma_{MP} - \Gamma_{ME})(1 - S_{22}^M \Gamma_{LME})\Gamma_{LMP}}{\Gamma_{LMP} - \Gamma_{LME}}. \qquad (40)$$

Rearranging Equation (30) yields Equation (41) as follows:

$$S_{22}^M = \Gamma'_{LMP} - \frac{S_{21}^M S_{12}^M \Gamma'_{MP}}{1 - S_{11}^M \Gamma'_{MP}}. \qquad (41)$$

Substituting Equations (39) and (40) into Equation (41) yields Equation (42) as follows:

$$S_{22}^M = \Gamma'_{LMP} - \frac{(\Gamma_{MP} - \Gamma_{ME})(1 - S_{22}^M \Gamma_{LMP})(1 - S_{22}^M \Gamma_{LME})\Gamma'_{MP}}{(\Gamma_{LMP} - \Gamma_{LME})(1 - |\Gamma_{MP}|^2) + (\Gamma_{MP} - \Gamma_{ME})(1 - S_{22}^M \Gamma_{LME})\Gamma_{LMP}\Gamma'_{MP}}. \qquad (42)$$

Solving Equation (42) for the matrix parameter $S_{22}^M$ yields Equation (43) as follows:

$$S_{22}^M = \frac{|\Gamma_{LMP}|^2 - \Gamma'_{LMP}\Gamma_{LME} + |\Gamma_{MP}|^2\Gamma'_{LMP}\Gamma_{LME} - |\Gamma_{LMP}|^2\Gamma'_{MP}\Gamma_{ME} - |\Gamma_{MP}|^2\Gamma'_{MP}\Gamma_{ME}}{\Gamma_{LMP} - \Gamma_{LME} - |\Gamma_{MP}|^2|\Gamma_{LMP}|^2\Gamma_{LME} - |\Gamma_{LMP}|^2\Gamma'_{MP}\Gamma_{ME}\Gamma_{LME} - \Gamma_{LMP}|\Gamma_{MP}|^2 + \Gamma'_{MP}\Gamma_{ME}\Gamma_{LME}}. \qquad (43)$$

Once the matrix parameter $S_{22}^M$ is calculated using Equation (43) in terms of the voltage reflection coefficients $\Gamma_{ME}$, $\Gamma_{MP}$, $\Gamma_{LMP}$, and $\Gamma_{LME}$ given by Equations (21)-(24), and assuming that the network is reciprocal such that $S_{21}^M = S_{12}^M$, the remaining matrix parameters $S_{11}^M$, $S_{12}^M$, and $S_{21}^M$ can be calculated using Equations (39) and (40).

S Matrix for Peak Output Matching Network

The S matrix $S^P$ for the peak output matching network 136 is given by Equation (44) as follows:

$$S^P = \begin{bmatrix} S_{11}^P & S_{12}^P \\ S_{21}^P & S_{22}^P \end{bmatrix} \qquad (44)$$

During high-power operations, going from the combining node 140 toward the peak device 134, the peak output matching network 136 converts the high-power peak load impedance $Z_{LPP}$ into the high-power peak-device impedance $Z_{PP}$. During high-efficiency operations in which the peak device 134 is off, going from the peak device 134 to toward the combining node 140, the peak output matching network 136 converts the peak-device off-state impedance $Z_{POFF}$ into the off-state peak load impedance $Z_{LPOFF}$.

The high-power peak-device impedance $Z_{PP}$ is known from the load-pull data selections. The high-power peak load impedance $Z_{LPP}$ is a function of the user-selected, high-power main load impedance $Z_{LMP}$ (see previous section) and is given by Equation (45) as follows:

$$Z_{LPP} = Z_{LMP}/(N_{comb}-1). \qquad (45)$$

The peak-device off-state impedance $Z_{POFF}$ is directly measured from the peak device 134, and the off-state peak load impedance $Z_{LPOFF}$ is given by $Z_{LPOFF} = N_{OFF} Z_{POFF}$, where:

$$N_{OFF} = \frac{1 + |\Gamma|}{1 - |\Gamma|} \qquad (46)$$

and $$|\Gamma| = \left| \frac{\Gamma_{POFF} - \Gamma'_{PP}}{1 - \Gamma_{PP}\Gamma_{POFF}} \right|. \qquad (47)$$

According to Equation (5), respective voltage reflection coefficients $\Gamma_{LPP}$, $\Gamma_{LPOFF}$, $\Gamma_{PP}$, and $\Gamma_{POFF}$ for the four impedances $Z_{LPP}$, $Z_{LPOFF}$, $Z_{PP}$, and $Z_{POFF}$ can be calculated by Equations (48)-(51) as follows:

$$\Gamma_{LPP} = \frac{Z_{LPP} - Z_0}{Z_{LPP} + Z_0}, \qquad (48)$$

$$\Gamma_{LPOFF} = \frac{Z_{LPOFF} - Z_0}{Z_{LPOFF} + Z_0}, \qquad (49)$$

$$\Gamma_{PP} = \frac{Z_{PP} - Z_0}{Z_{PP} + Z_0}, \qquad (50)$$

$$\Gamma_{POFF} = \frac{Z_{POFF} - Z_0}{Z_{POFF} + Z_0}. \qquad (51)$$

Referring to FIG. 2, for the peak output matching network 136, for high-power operations:

$$\Gamma_L = \Gamma_{LPP}, \qquad (52)$$

$$\Gamma_S = \Gamma_{PP}, \qquad (53)$$

$$\Gamma_{IN} = \Gamma_{PP}, \qquad (54)$$

$$\Gamma_{OUT} = \Gamma_{LPP}. \qquad (55)$$

Substituting Equations (52) and (54) into Equation (6) yields Equation (56) as follows:

$$\Gamma_{PP} = S_{11}^P + \frac{S_{12}^P S_{21}^P \Gamma_{LPP}}{1 - S_{22}^P \Gamma_{LPP}}. \qquad (56)$$

Similarly, substituting Equations (53) and (55) into Equation (7) yields Equation (57) as follows:

$$\Gamma'_{LPP} = S_{22}^P + \frac{S_{12}^P S_{21}^P \Gamma'_{PP}}{1 - S_{11}^P \Gamma'_{PP}}. \qquad (57)$$

Referring to FIG. 2, for the peak output matching network 136, for high-efficiency operations:

$$\Gamma_L = \Gamma_{LPOFF}, \qquad (58)$$

$$\Gamma_S = \Gamma_{POFF}, \qquad (59)$$

$$\Gamma_{IN} = \Gamma_{POFF}, \qquad (60)$$

$$\Gamma_{OUT} = \Gamma_{LPOFF}, \qquad (61)$$

Substituting Equations (58) and (60) into Equation (6) yields Equation (62) as follows:

$$\Gamma'_{POFF} = S_{11}^P + \frac{S_{12}^P S_{21}^P \Gamma_{LPOFF}}{1 - S_{22}^P \Gamma_{LPOFF}}. \quad (62)$$

Similarly, substituting Equations (59) and (61) into Equation (7) yields Equation (63) as follows:

$$\Gamma_{LPOFF} = S_{22}^M + \frac{S_{12}^M S_{21}^M \Gamma_{POFF}}{1 - S_{11}^M \Gamma_{POFF}}. \quad (63)$$

Subtracting Equation (62) from Equation (56) yields Equation (64) as follows:

$$\Gamma_{PP} - \Gamma'_{POFF} = S_{12}^P S_{21}^P \left( \frac{\Gamma_{LPP}}{1 - S_{22}^P \Gamma_{LPP}} - \frac{\Gamma'_{LPOFF}}{1 - S_{22}^P \Gamma'_{LPOFF}} \right). \quad (64)$$

Subtracting Equation (63) from Equation (57) yields Equation (65) as follows:

$$\Gamma'_{LPP} - \Gamma_{LPOFF} = S_{12}^P S_{21}^P \left( \frac{\Gamma'_{PP}}{1 - S_{11}^P \Gamma'_{PP}} - \frac{\Gamma_{OFF}}{1 - S_{11}^P \Gamma_{OFF}} \right). \quad (65)$$

Rearranging Equation (65) yields Equation (66) as follows:

$$S_{12}^M S_{21}^M = \frac{(\Gamma_{MP} - \Gamma_{ME})(1 - S_{22}^M \Gamma_{LMP})(1 - S_{22}^M \Gamma_{LME})}{\Gamma_{LMP} - \Gamma_{LME}}. \quad (66)$$

Substituting Equation (66) into Equation (56) and rearranging yields Equation (67) as follows:

$$S_{11}^P = \Gamma_{PP} - \frac{(\Gamma_{PP} - \Gamma'_{POFF})(1 - S_{22}^P \Gamma'_{LPOFF}) \Gamma_{LPP}}{\Gamma_{LPP} - \Gamma'_{LPOFF}}. \quad (67)$$

Rearranging Equation (63) yields Equation (68) as follows:

$$S_{22}^P = \Gamma_{LPOFF} - \frac{S_{21}^P S_{12}^P \Gamma_{POFF}}{1 - S_{11}^P \Gamma_{POFF}}. \quad (68)$$

Substituting Equations (66) and (67) into Equation (68) yields Equation (69) as follows:

$$S_{22}^P = \Gamma_{LPOFF} - \frac{(\Gamma_{PP} - \Gamma'_{POFF})(1 - S_{22}^P \Gamma_{LPP})(1 - S_{22}^P \Gamma'_{LPOFF}) \Gamma_{POFF}}{(\Gamma_{LPP} - \Gamma'_{LPOFF})(1 - \Gamma_{PP} \Gamma_{POFF}) + (\Gamma_{PP} - \Gamma'_{POFF})(1 - S_{22}^P \Gamma'_{LPOFF}) \Gamma_{LPP} \Gamma_{POFF}}. \quad (69)$$

Solving Equation (69) for the matrix parameter $S_{22}^P$ yields Equation (70) as follows:

$$S_{22}^P = \frac{\Gamma_{PP} \Gamma_{POFF} |\Gamma_{LPOFF}|^2 - |\Gamma_{LPOFF}|^2 - \Gamma_{LPP} \Gamma_{LPOFF} |\Gamma_{POFF}|^2 + \Gamma_{LPP} \Gamma_{LPOFF} + |\Gamma_{POFF}|^2 - \Gamma_{PP} \Gamma_{POFF}}{\Gamma_{LPP} \Gamma_{POFF} \Gamma_{PP} |\Gamma_{LPOFF}|^2 - \Gamma_{LPP} |\Gamma_{POFF}|^2 |\Gamma_{LPOFF}|^2 + \Gamma_{LPP} - \Gamma'_{LPOFF} - \Gamma_{LPP} \Gamma_{PP} \Gamma_{POFF} + |\Gamma_{POFF}|^2 \Gamma'_{LPOFF}}. \quad (70)$$

Once the matrix parameter $S_{22}^P$ is calculated using Equation (70) in terms of the voltage reflection coefficients $\Gamma_{PP}$, $\Gamma_{POFF}$, $\Gamma_{LPP}$, and $\Gamma_{LPOFF}$ given by Equations (48)-(51), and assuming that the network is reciprocal such that $S_{21}^P = S_{12}^P$, the remaining matrix parameters $S_{11}^P$, $S_{12}^P$, and $S_{21}^P$ can be calculated using Equations (66) and (67).

Network Phase Delay

After determining the proper input power split between the main and peak branches and the S matrices for all five of the different matching networks in amplifier 100, what remains to be determined is the phase delay for each branch.

Contributions to the phase delay in the main branch 120 are from (i) the main input matching network 122 loaded by the input impedance of the main amplifier device 124 biased in Class-AB, (ii) the main device 124 itself, and (iii) the main output matching network 126 terminated by the main branch load impedance looking into the combining node 140 away from the main output matching network 126, where the main branch load impedance is a function of the main device output power $P_M$, the peak device output power $P_P$, the combining node impedance $Z_{node}$, and the off-state peak load impedance $Z_{LPOFF}$.

Contributions to the phase delay in the peak branch 130 are from (i) the peak input matching network 132 loaded by the input impedance of the peak amplifier device 134 biased in Class-C, (ii) the peak device 134 itself, and (iii) the peak output matching network 136 terminated by the peak branch load impedance looking into the combining node 140 away from the peak output matching network 136, where the peak brand load impedance is function of the main device output power $P_M$, the peak device output power $P_P$, the combining node impedance $Z_{node}$, and off-state peak load impedance $Z_{LPOFF}$.

In a typical application, the goal is to achieve a prescribed level of phase matching between the main and peak branches. Since there is no guarantee that the phase delays from the two branches will fulfill such prescribed condition, one of the two branches can be additionally delayed by means of inserting an input phase offset line (the function of which will be subsumed into the corresponding input matching network) or a phase shifter, or by means of digital signal processing in case of independent input to the main and peak branches. The phase delay contribution from amplifier devices (e.g., transistors) is measured during the load-pull process. If the S-parameters and load impedances are known, then the phase delay contribution from individual two-port networks characterized by S matrices can be calculated.

Figure 3:
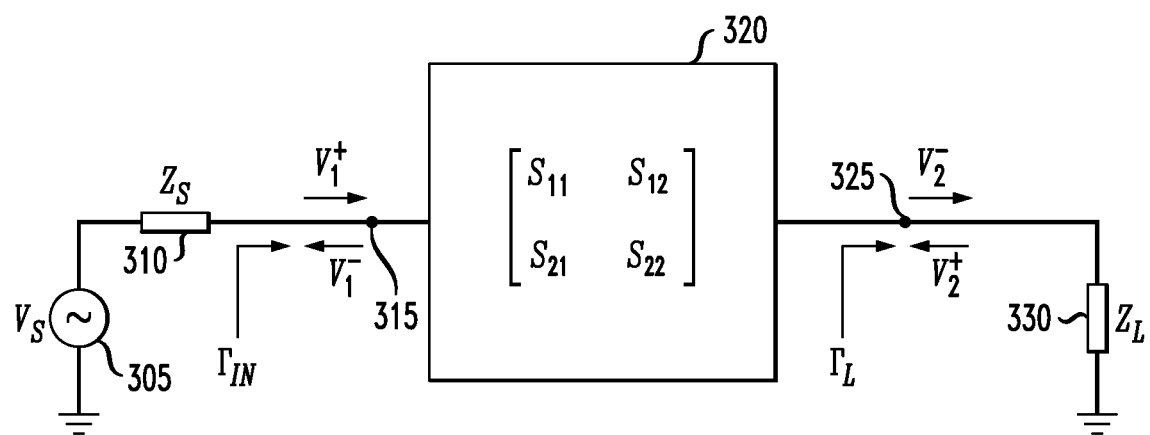
FIG. 3 shows a generic matching network.

FIG. 3 shows a generic matching network 320 having (i) input port 315 connected to a powered input load 310 having impedance $Z_S$ and (ii) output port 325 connected to a grounded output load 330 having impedance $Z_L$ and voltage reflection coefficient $\Gamma_L$, where input load 310 is powered by power supply 305 applying complex voltage signal $V_S$. The input voltage reflection coefficient $\Gamma_{IN}$ for matching network 320 is given by previous Equation (5), where $S_{11}$, $S_{12}$, $S_{21}$, and $S_{22}$ are the coefficients of the S matrix for matching network 320.

In general, a complex voltage wave $V_n$ at a port n of a matching network is given by Equation (71) as follows:

$$V_n = V_n^+ + V_n^- \tag{71}$$

where $V_n^+$ is the voltage wave heading towards the matching network and incident on port n, and $V_n^-$ is the voltage wave reflected from port n and heading away from the matching network. Matching network 320 has two ports: input port 315 at its upstream side and output port 325 at its downstream side.

The input voltage reflection coefficient $\Gamma_{IN}$ is given by Equation (72) as follows:

$$\Gamma_{IN} = \frac{V_1^-}{V_1^+}. \tag{72}$$

Similarly, the load voltage reflection coefficient $\Gamma_L$ is given by Equation (73) as follows:

$$\Gamma_L = \frac{V_2^+}{V_2^-}. \tag{73}$$

Substituting Equation (72) into Equation (71) for Port 1 yields Equation (74) as follows:

$$V_1 = V_1^+ + V_1^- = V_1^+(1 + \Gamma_{IN}). \tag{74}$$

Rearranging Equation (5) for impedance $Z_{IN}$ yields Equation (75) as follows:

$$Z_{IN} = Z_0 \frac{1 + \Gamma_{IN}}{1 - \Gamma_{IN}} \tag{75}$$

Substituting Equation (6) into Equation (75) yields Equation (76) as follows:

$$Z_{IN} = Z_0 \frac{(1 + S_{11})(1 - S_{22}\Gamma_L) + S_{12}S_{21}\Gamma_L}{(1 - S_{11})(1 - S_{22}\Gamma_L) - S_{12}S_{21}\Gamma_L} \tag{76}$$

The following Equation (77) represents the relationship between the voltage wave $V_1$ at Port 1 and the source voltage wave $V_S$ generated by power supply 305 after substituting in Equation (76):

$$V_1 = \frac{Z_{IN}}{Z_{IN} + Z_S} V_S \tag{77}$$
$$= \frac{Z_0[(1+S_{11})(1-S_{22}\Gamma_L) + S_{21}S_{12}\Gamma_L]V_S}{Z_0[(1+S_{11})(1-S_{22}\Gamma_L) + S_{21}S_{12}\Gamma_L] + Z_S[(1-S_{11})(1-S_{22}\Gamma_L) - S_{21}S_{12}\Gamma_L]}$$

Substituting Equation (6) into Equation (74) yields Equation (78) as follows:

$$V_1 = V_1^+ + V_1^- \tag{78}$$
$$= V_1^+(1 + \Gamma_{IN})$$
$$= V_1^+ \frac{(1+S_{11})(1-S_{22}\Gamma_L) + S_{21}S_{12}\Gamma_L}{1 - S_{22}\Gamma_L}$$

Substituting $V_1$ from Equation (78) in place of $V_1$ in Equation (77) and solving for $V_1^+$ yields Equation (79a) as follows:

$$V_1^+ = \frac{Z_0(1 - S_{22}\Gamma_L)V_S}{Z_0[(1+S_{11})(1-S_{22}\Gamma_L) + S_{21}S_{12}\Gamma_L] + Z_S[(1-S_{11})(1-S_{22}\Gamma_L) - S_{21}S_{12}\Gamma_L]} \tag{79a}$$

From the relationship $V_2^- = S_{21}V_1^+ + S_{22}V_2^+$ of Equation (1) and from the definition of the reflection coefficient $$\Gamma_L = \frac{V_2^+}{V_2^-},$$

we get Equation (79b) as follows:

$$V_2^- = \frac{S_{21}V_1^+}{1 - S_{22}\Gamma_L}. \tag{79b}$$

Substituting the expression for $V_1^+$ from the Equation (79a) into Equation (79b) yields Equation (80) as follows:

$$V_2^- = \frac{S_{21}V_1^+}{1-S_{22}\Gamma_L} = \frac{Z_0 S_{21} V_S}{Z_0[(1+S_{11})(1-S_{22}\Gamma_L)+S_{21}S_{12}\Gamma_L] + Z_S[(1-S_{11})(1-S_{22}\Gamma_L)-S_{21}S_{12}\Gamma_L]} \tag{80}$$

Applying the definition of the reflection coefficient $$\Gamma_L = \frac{V_2^+}{V_2^-}$$

to Equation (80) yields Equation (81) as follows:

$$V_2^+ = \Gamma_L V_2^- = \frac{Z_0 S_{21} \Gamma_L V_S}{Z_0[(1+S_{11})(1-S_{22}\Gamma_L)+S_{21}S_{12}\Gamma_L] + Z_S[(1-S_{11})(1-S_{22}\Gamma_L)-S_{21}S_{12}\Gamma_L]} \tag{81}$$

Substituting Equations (80) and (81) into Equation (71) for Port 2 yields Equation (82) as follows:

$$V_2 = V_2^+ + V_2^- = \frac{Z_0 S_{21}(1+\Gamma_L)V_S}{Z_0[(1+S_{11})(1-S_{22}\Gamma_L)+S_{21}S_{12}\Gamma_L] + Z_S[(1-S_{11})(1-S_{22}\Gamma_L)-S_{21}S_{12}\Gamma_L]} \tag{82}$$

Dividing Equation (82) by Equation (77) yields Equation (83) as follows:

$$\frac{V_2}{V_1} = \frac{S_{21}(1+\Gamma_L)}{(1+S_{11})(1-S_{22}\Gamma_L)+S_{21}S_{12}\Gamma_L} = \frac{S_{21}(1+\Gamma_L)}{1 + S_{11} - (S_{22} + S_{11}S_{22} - S_{21}S_{12})\Gamma_L} \tag{83}$$

wherein the complex ratio of voltages can be represented according to Equation (84) as follows:

$$\frac{V_2}{V_1} = \left|\frac{V_2}{V_1}\right| e^{j(\phi_2-\phi_1)} \qquad (84)$$

Where $\phi_1$ is the phase of the voltage wave at Port 1 and $\phi_2$ is the phase of the voltage wave at Port 2.

Substituting Equation (84) into Equation (83) yields Equation (85) as follows:

$$\left|\frac{V_2}{V_1}\right| e^{j(\phi_2-\phi_1)} = \left|\frac{S_{21}(1+\Gamma_L)}{1+S_{11}-(S_{22}+S_{11}S_{22}-S_{21}S_{22})\Gamma_L}\right| e^{j\phi} \qquad (85)$$

where the phase delay $\Delta\phi = \phi_2 - \phi_1 = \phi$ for matching network 320. Since the S matrices of the five matching networks in amplifier 100 are known, Equation (85) can be used to determine the phase delay across each of those matching networks.

Design Technique for a Two-Way Doherty Amplifier

Figure 4:
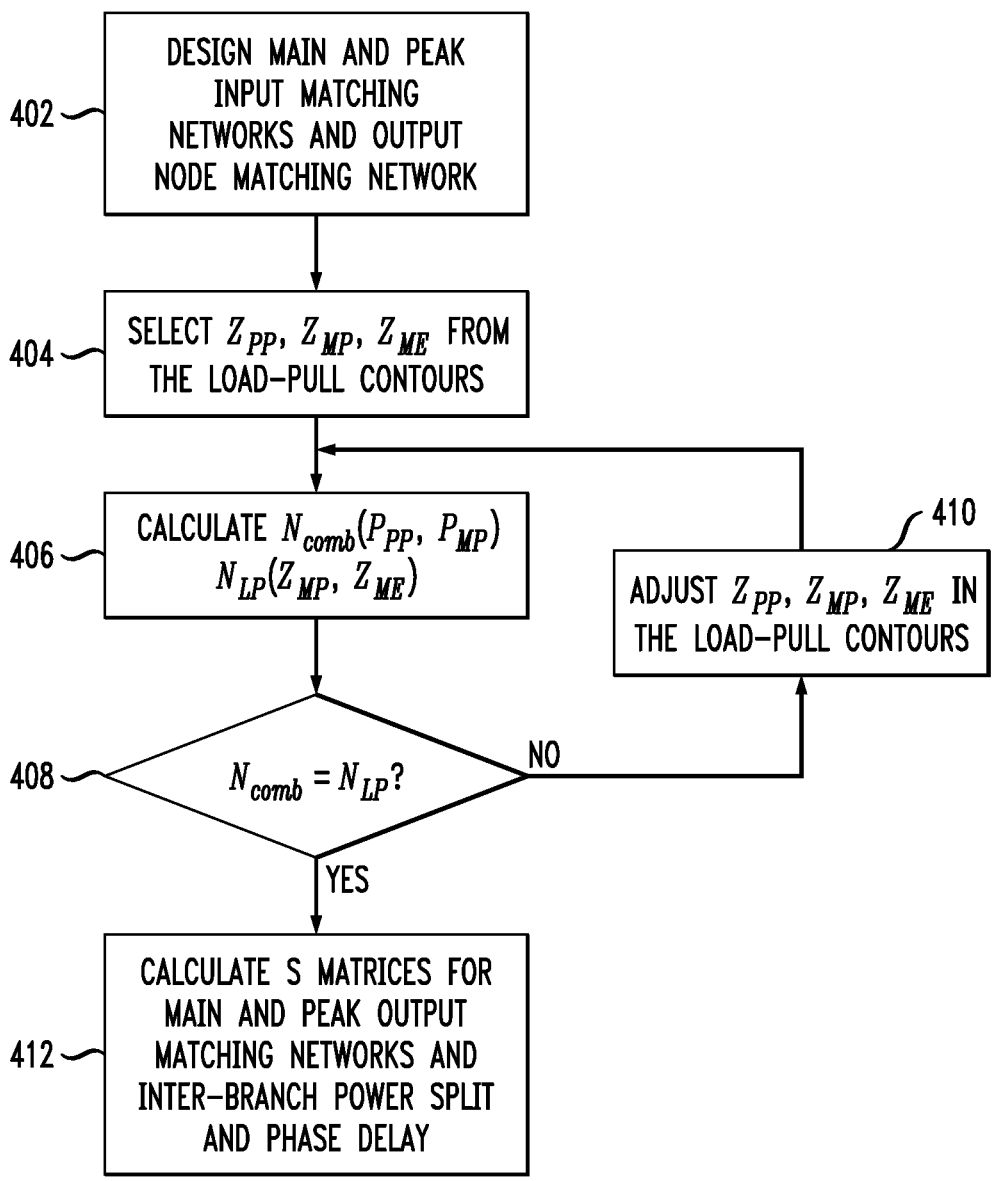
FIG. 4 shows a flow diagram of technique for designing the two-way Doherty amplifier of FIG. 1.

FIG. 4 shows a flow diagram of technique 400 for designing two-way Doherty amplifier 100 of FIG. 1.

In step 402 of design (i.e., synthesis) technique 400, main and peak input matching networks 122 and 132, and node matching network 150 are designed using the techniques described previously. Once the input power split that satisfies requirements for maximum power levels is determined, it remains fixed. The impedance for the maximum peak power should also remain fixed throughout the remainder of the design procedure.

The iterative loop formed by steps 404-410 is implemented to determine main and peak impedance values $Z_{PP}$, $Z_{MP}$, and $Z_{ME}$ that satisfy the condition of step 408 that the node impedance modulation ratio $N_{comb}$ at the combining node 140 is substantially equal to the main device impedance modulation ratio $N_{LP}$ between $Z_{MP}$ and $Z_{ME}$, where:

$Z_{PP}$ is the impedance presented to the peak device 134 during high-power operations;

$Z_{MP}$ is the impedance presented to the main device 124 during high-power operations; and $Z_{ME}$ is the impedance presented to the main device 124 during average-power, high-efficiency operations.

In particular, in step 404, initial values for the three impedances $Z_{PP}$, $Z_{MP}$, and $Z_{ME}$ are selected using the corresponding load-pull contours. These initial selections are made by educated guesses based on the device load-pull performance and the amplifier specifications. For example, if we need to design a 200 W amplifier, we may start with (i) an impedance on the main device that has 100 W capability and (ii) an impedance on the peak device that has 100 W capability. There are multiple impedances that satisfy this power condition, but the resulting amplifier may substantially differ in gain and efficiency, which leads to an iterative process of further selection. The power ratio between the main and peak device may change, which will lead to further iterations in the selection process.

In step 406, the node impedance modulation ratio $N_{comb}$ and the main device impedance modulation ratio $N_{LP}$ are calculated using Equations (2b) and (3), respectively.

In step 408, it is determined whether the node impedance modulation ratio $N_{comb}$ sufficiently matches the main device impedance ratio $N_{LP}$, e.g., to within a specified threshold percentage. If not, then processing continues to step 410, where one or more of the three impedances $Z_{PP}$, $Z_{MP}$, and $Z_{ME}$ are adjusted using the corresponding load-pull contours. The impedances are moved in the impedance space of the load-pull contours by means of user-controlled cursors. Moving a cursor in the corresponding load-pull contour plot will alter the value of the impedance and the associated load-pull data, which will cause the algorithm to reevaluate matching network S-parameter values, values of $N_{comb}$, $N_{LP}$, and all other parameters of the circuit that are dependent on these impedances and the transistor load-pull data associated with these impedances. Processing then returns to step 406 to determine the impedance modulation ratio $N_{comb}$ and the main device impedance modulation ratio $N_{LP}$ using the updated impedances.

When step 408 determines that the node impedance modulation ratio $N_{comb}$ sufficiently matches the main device impedance modulation ratio $N_{LP}$, then processing continues to step 412, where the S matrices for the main and peak output matching networks 126 and 136, the inter-branch power split (implemented by power splitter 110), and the inter-branch phase delay are calculated based on the final values for the three impedances $Z_{PP}$, $Z_{MP}$, and $Z_{ME}$ determined by steps 404-410, using the techniques described previously.

Analysis of a Two-Way Doherty Amplifier

After two-way Doherty amplifier 100 of FIG. 1 has been designed, e.g., using design technique 400 of FIG. 4, appropriate sets of load-pull data can be used to analyze the amplifier to establish relationships between the values $P_{in}^M$ and $Z_{in}^M$ on the input side and the values $P_M$, $Z_M$, and $\phi_M$ on the output side of the main device 124 and also between the values $P_{in}^P$, and $Z_{in}^P$ on input side and the values $P_P$, $Z_P$, and $\phi_P$ on the output side of the peak device 134.

Figure 5:
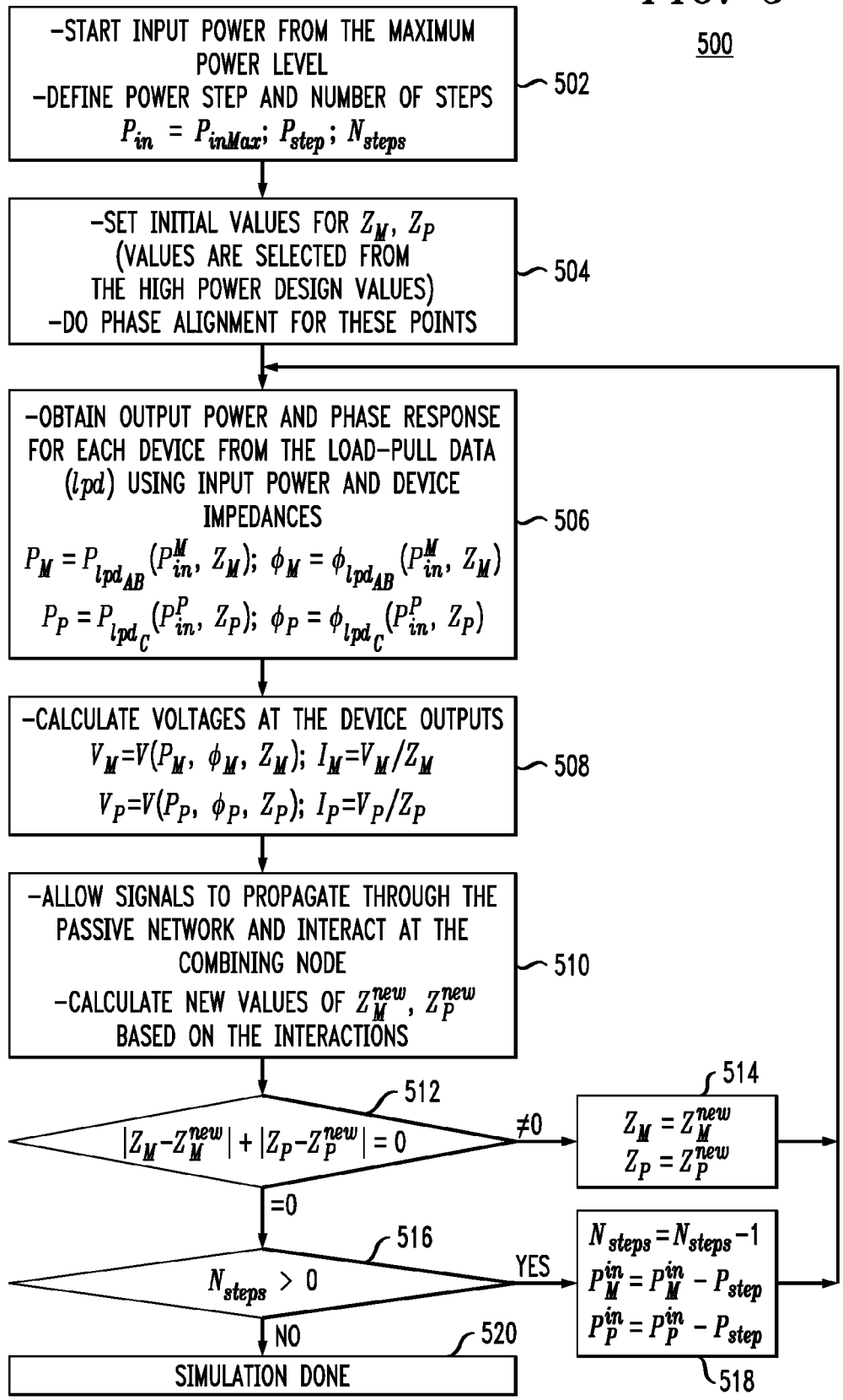
FIG. 5 shows a flow diagram of a technique for analyzing the two-way Doherty amplifier of FIG. 1.

FIG. 5 shows a flow diagram of a technique 500 for analyzing two-way Doherty amplifier 100 of FIG. 1. Analysis technique 500 consists of two nested loops: an outer loop in which the amplifier is analyzed at different input power levels and an inner loop in which the impedance levels for the main and peak output matching networks are adjusted for a particular input power level until those impedance levels converge on steady-state values.

In analysis technique 500, the input power level starts at the maximum power level for the amplifier and is decremented for each iteration of the outer loop for a specified number of iteration steps designed to bring the input power level down to an appropriate minimum power level for the amplifier. Analysis technique 500 starts the input power sweep of the outer loop from the maximum power level because impedances and other parameters were selected during design technique 400 of FIG. 4 for this same maximum power level, which ensures that, in the absence of error in the design, analysis technique 500 will rapidly if not immediately converge to satisfy the inner loop condition of step 512 for the first iteration of the inner loop for the first iteration of the outer loop. In an alternative implementation of the analysis technique, the input power level could start at the minimum power level and be incremented for each subsequent iteration of the outer loop until the maximum power level is reached.

For the initial iteration of the inner loop and the initial iteration of the outer loop, the main and peak output matching network impedance levels $Z_M$ and $Z_P$ are initialized to high-power impedance levels. If the design is determined using design technique 400 of FIG. 4, then the initial $Z_M$ and $Z_P$ values will be respectively equal to the final values of $Z_{MP}$ and $Z_{PP}$ from design technique 400. If an external design is used (i.e., a design determined using some other technique), then educated guesses for the impedance values $Z_{MP}$ and $Z_{PP}$ are used to start the iterative process. For each subsequent iteration of the outer loop, the steady-state main and peak output matching network impedance levels $Z_M^{new}$ and $Z_P^{new}$ determined during the previous outer-loop iteration are retained as the initial values for the first iteration of the inner loop.

In particular, analysis technique 500 begins at step 502, where the input power level $P_{in}$ is initialized to the maximum power level $P_{inMax}$. Based on the known power split performed by input power splitter 110, the magnitudes of the main branch input power level $P_{IN}^M$ and the peak branch input power level $P_{IN}^P$ can be determined from the input power level $P_{in}$. In addition, step 502 specifies the size $P_{step}$ of each power level decrement and the number $N_{step}$ of such decrements for the analysis. Note that, for this explanation, all powers are expressed in dBm or other suitable relative units.

In step 504, the impedance level $Z_M$ of main amplifier device 124 and the network impedance level $Z_P$ of peak amplifier device 134 are initialized to values for high-power operations determined during design technique 400 of FIG. 4.

In addition, phase alignments for the main and peak branches are performed during step 504. Equation (85) is used to calculate the phase delay of each block within each branch under varying load conditions that they experience during the amplifier operation. The sum of the phase delays for each block in a branch will give the overall phase delay for the branch. Since there are two (or more) branches, and we want to make signals combine at the combining node under specified phase conditions (in-phase or otherwise specified phase relation), the phase of each peak branch may need to be adjusted with respect to the main branch to achieve the specified phase conditions. For in-phase alignment, for example, if (i) the main branch has a delay of 97° and (ii) the peak branch has a delay of 85°, in order to make the currents in phase at the combining node 140, the peak branch can be delayed by 12° by delaying the peak input signal by 12°. If the new delay for the main branch is now 95° and new delay for the peak branch (with the previous delay correction of 12°) is 98° (this can happen due to load conditions changing somewhat as a consequence of the phase adjustment), an additional delay correction of −3° can be applied to the peak branch (for a net delay correction of 9°), such that the delay for the main branch is now 96° and the delay for the peak branch is now 96°, at which point phase alignment is completed. This is done directly by monitoring the branch currents at the combining node. Equation (83) is buried in the calculations that yield proper values for the branch currents at the combining node. In the phase-alignment process, $Z_M$ and $Z_P$ will also change somewhat but this is expected.

If the proper design impedances are not known, e.g., because the amplifier was designed using a technique other than design technique 400 of FIG. 4, then "phase alignment needs to be guessed as well and we need to go through iterations to achieve convergence and if necessary re-evaluated our phasing guess." Looking at the constant input power load-pull contours for the main and peak devices, the most plausible values for impedances $Z_M$ and $Z_P$ for high-power performance are determined. The phase offset needed for an in-phase condition is then determined by observing the initial phase mismatch of the currents at the combining node and using it to obtain convergence for this initial value of input power. The technique does not yet proceed to a full input power sweep. Changes are made in phase alignment if necessary and the convergence is repeated at the initial input power level. This is done until a desirable phase alignment is achieved. Only then does the technique proceed to the full input power sweep.

In step 506, the output power $P_M$ and phase response $\phi_M$ of main amplifier device 124 are determined from the load-pull data (e.g., $P_{lpdAB}$, $\phi_{lpdAB}$ for the main device biased in Class-AB) using the main branch input power level $P_{IN}^M$ and the main amplifier device impedance level $Z_M$. The power and phase values are read from the load-pull power sweeps. These parameters are directly measured in the active device load-pull process with some level of interpolation possibly involved. Similarly, the output power $P_P$ and phase response $\phi_P$ of peak amplifier device 134 are determined from the load-pull data (e.g., $P_{lpdC}$, $\phi_{lpdC}$ for the peak device biased in Class-C) using the peak branch input power level $P_{IN}^P$ and the peak amplifier device impedance level $Z_P$.

In step 508, the voltages $V_M$ and $V_P$ and currents $I_M$ and $I_P$ output from the main and peak amplifier devices 124 and 134 are determined.

Figure 6:
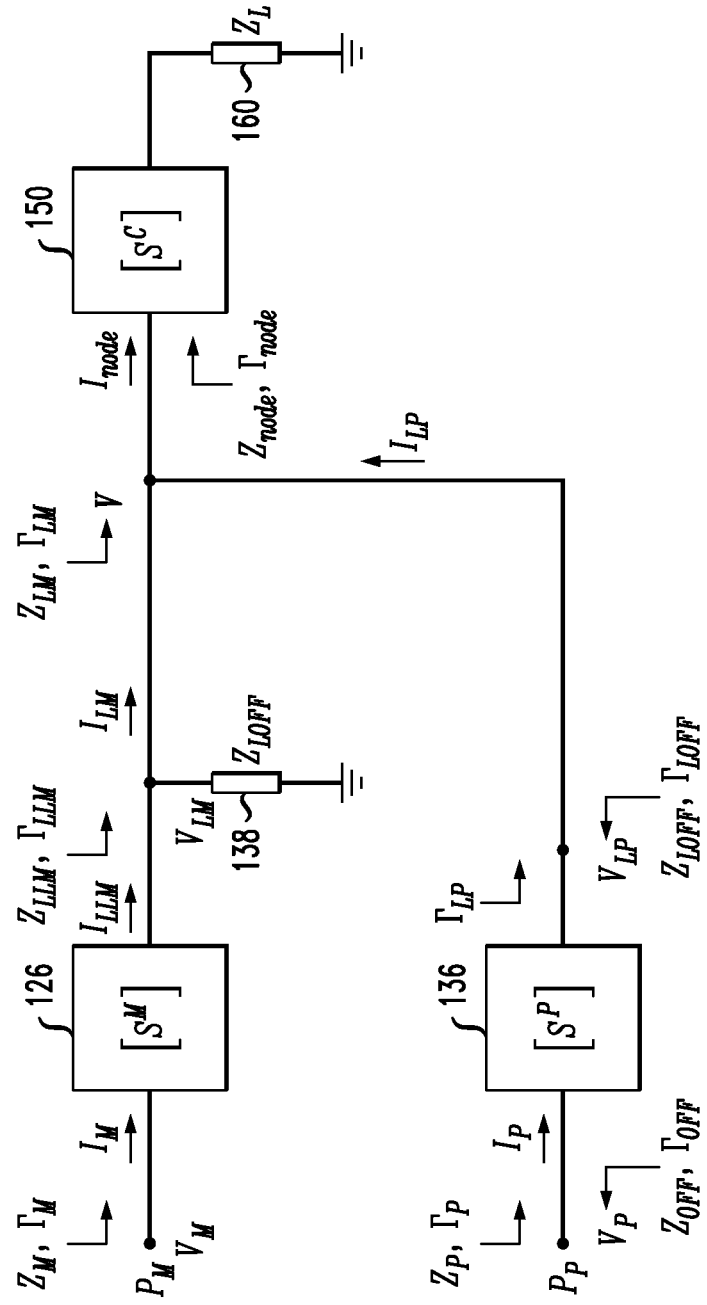
FIG. 6 shows a block diagram representing the passive output combining network of the two-way Doherty amplifier of FIG. 1.

FIG. 6 shows a block diagram representing passive output combining network 170 of FIG. 1. In FIG. 6, load 138 represents the load on the main branch contributed by the peak branch when the peak branch is disabled. It is the loading effect of the peak branch on the main branch when the peak device is in the off-state.

For the main branch 120 going from the main device 124 toward the combining node 140, calculations for converting the main device impedance $Z_M$ into the main voltage reflection coefficient $\Gamma_M$, and vice versa, are given by Equations (86) and (87) as follows:

$$\Gamma_M = \frac{Z_M - Z_0}{Z_M + Z_0} \quad (86)$$

$$Z_M = Z_0 \frac{1 + \Gamma_M}{1 - \Gamma_M} = \frac{V_M}{I_M} = |Z_M| e^{j\phi_{Z_M}} \quad (87)$$

The main device voltage $V_M$ is calculated from the known main device power $P_M$ and main device impedance $Z_M$ (complex power $S_M$ is fully determined by known $P_M$ and $Z_M$) as follows. Complex power $S_M$ of the main device has a real part $P_M$ that is known from the load-pull data and an imaginary part $Q_M$ that is unknown. However, $S_M$ is also given by $$\frac{|V_M|^2}{2Z_M^*}$$

in which the impedance $Z_M$ is known from load-pull data. Known values of $P_M$ and $Z_M$ allow the calculation of $V_M$ and $$I_M = \frac{V_M}{Z_M},$$

which are used in the circuit analysis of output combining network 170. As such, the complex power $S_M$ of the main device is given by Equation (88) as follows:

$$S_M = P_M + jQ_M = \frac{|V_M|^2}{2Z_M^*} = \frac{|I_M|^2 Z_M}{2} = \frac{V_M I_M^*}{2} \quad (88)$$

and the voltage $V_M$ of the main device is given by Equation (89) as follows:

$$V_M = |V_M| e^{j\phi_M} = \sqrt{\frac{2P_M}{\text{Re}\{Z_M\}}} |Z_M| e^{j\phi_M} \quad (89)$$

where
$\phi_M$ is used as reference phase ($\phi_M = 0$) or measured $$V_M = \sqrt{\frac{2P_M}{\text{Re}\{Z_M\}}} |Z_M|$$

For the peak branch 130 going from the peak device 134 toward the combining node 140, calculations for converting the peak device impedance $Z_P$ into the peak voltage reflection coefficient $\Gamma_P$, and vice versa, are given by Equations (90) and (91) as follows:

$$\Gamma_P = \frac{Z_P - Z_0}{Z_P + Z_0} \qquad (90)$$

$$Z_P = Z_0 \frac{1 + \Gamma_P}{1 - \Gamma_P} = \frac{V_P}{I_P} = |Z_P|e^{j\phi_{Z_P}} \qquad (91)$$

The peak device voltage $V_P$ is calculated from the known peak device power $P_P$ and peak device impedance $Z_P$ (complex power $S_P$ is fully determined by known $P_P$ and $Z_P$) as follows. Complex power $S_P$ of the peak device has a real part $P_P$ that is known from the load-pull data and an imaginary part $Q_P$ that is unknown. However, $S_P$ is also given by $$\frac{|V_P|^2}{2Z_P^*}$$

in which the impedance $Z_P$ is known from load-pull data. Known values of $P_P$ and $Z_P$ allow the calculation of $V_P$ and $$I_P = \frac{V_P}{Z_P},$$

which are used in the circuit analysis of output combining network 170. As such, the complex power $S_P$ of the peak device is given by Equation (92) as follows:

$$S_P = P_P + jQ_P = \frac{|V_P|^2}{2Z_P^*} = \frac{|I_P|^2 Z_P}{2} = \frac{V_P I_P^*}{2} \qquad (92)$$

and the voltage $V_P$ of the peak device is given by Equation (93) as follows:

$$V_P = |V_P|e^{j\phi_P} = \sqrt{\frac{2P_P}{\text{Re}\{Z_P\}}} |Z_P|e^{j\phi_P} \qquad (93)$$

Once the voltages and currents on the device side for each branch are known, currents on the node side of each branch can be determined, which enables the calculation of loading impedances for each branch and in turn enable the calculation of new impedances presented to the devices. In particular, in step 510, the signals are allowed to propagate through the passive network formed by the main and peak output matching networks 126 and 136, the node matching network 150, and output load 160, and new values $Z_M^{new}$ and $Z_P^{new}$ for the main and peak amplifier device impedance levels are determined.

Load side main voltages, currents, and impedances are calculated from known main device side voltages, currents, impedances, and S-parameters of the main output matching network 126 as follows. Since $V_M$, $I_M$, $Z_M$, and $\Gamma_M$ are known on the device side of main output matching network 126 and S-parameters $[S^M]$ of the network 126 are known as well, $V_{LM}$, $I_{LLM}$, $Z_{LLM}$, and $\Gamma_{LLM}$ can be calculated on the node side of network 126 by using the expressions below, which result from circuit analysis. Calculations regarding $Z_{LOFF}$ are done to account for loading effect at combining node 140 due to the off-state impedance of the peak device transformed through network 126.

The relation between $\Gamma_M$ and $\Gamma_{LLM}$ is derived from the definition of the S-parameters (FIG. 2) and given by Equation (94) as follows:

$$\Gamma_M = S_{11}^M + \frac{S_{12}^M S_{21}^M \Gamma_{LLM}}{1 - S_{22}^M \Gamma_{LLM}} \qquad (94)$$

Rearranging Equation (94) to express $\Gamma_{LLM}$ in terms of $\Gamma_M$ yields Equation (95) as follows:

$$\Gamma_{LLM} = \frac{\Gamma_M - S_{11}^M}{S_{12}^M S_{21}^M + S_{22}^M (\Gamma_M - S_{11}^M)} \qquad (95)$$

where the corresponding impedance $Z_{LLM}$ is given by Equation (96) as follows:

$$Z_{LLM} = Z_0 \frac{1 + \Gamma_{LLM}}{1 - \Gamma_{LLM}} \qquad (96)$$

Using Equation (83), $V_{LM}$ can be expressed in terms of $V_M$, and used to calculate current $I_{LLM}$ according to Equations (97) and (98) as follows:

$$V_{LM} = \frac{S_{21}^M (1 + \Gamma_{LLM}) V_M}{1 + S_{11}^M - (S_{22}^M + S_{11}^M S_{22}^M - S_{12}^M S_{21}^M) \Gamma_{LLM}} \qquad (97)$$

$$I_{LLM} = \frac{V_{LM}}{Z_{LLM}} \qquad (98)$$

From the peak device side, off-state impedance $Z_{OFF}$ of the peak device is transformed into $Z_{LOFF}$ loading the main branch as follows:

$$Z_{OFF} = Z_0 \frac{1 + \Gamma_{OFF}}{1 - \Gamma_{OFF}}$$

$$\Gamma_{OFF} = \frac{Z_{OFF} - Z_0}{Z_{OFF} + Z_0}$$

$$\Gamma_{LOFF} = S_{22}^P + \frac{S_{12}^P S_{21}^P \Gamma_{OFF}}{1 - S_{11}^P \Gamma_{OFF}}$$

$$Z_{LOFF} = Z_0 \frac{1 + \Gamma_{LOFF}}{1 - \Gamma_{LOFF}}$$

The main branch load impedance $Z_{LM}$ is expressed in terms of $Z_{LLM}$ and $Z_{LOFF}$, where $Z_{LLM}$ is given by a parallel connection of $Z_{LM}$ and $Z_{LOFF}$. The main branch load current $I_{LM}$ entering the combining node is derived from the current $I_{LLM}$ entering the current divider formed by $Z_{LM}$ and $Z_{LOFF}$ as follows:

$$Z_{LM} = \frac{Z_{LLM} Z_{LOFF}}{Z_{LOFF} - Z_{LLM}};$$

$$I_{LM} = \frac{Z_{LOFF} - Z_{LLM}}{Z_{LOFF}} I_{LLM}$$

Load-side peak voltages, currents, and impedances are calculated from known peak device side voltages, currents, impedances, and S-parameters of the peak output matching network 136 as follows. Since $V_P$, $I_P$, $Z_P$, and $\Gamma_P$ are known on the device side of peak output matching network 136 and S-parameters $[S^P]$ of the network 136 are known, $V_{LP}$, $I_{LP}$, $Z_{LP}$, and $\Gamma_{LP}$ can be calculated on the node side of network 136 by using the expressions below, which result from circuit analysis. The manner in which peak expressions are derived is similar to that used for the main branch expression derivations presented above. The $Z_{node}$ calculation is the result of an impedance transformation through a network with known S-parameters.

$$\Gamma_P = S_{11}^P + \frac{S_{12}^P S_{21}^P \Gamma_{LP}}{1 - S_{22}^P \Gamma_{LP}} \Rightarrow \Gamma_{LP} = \frac{\Gamma_P S_{11}^P}{S_{12}^P S_{21}^P + S_{22}^P (\Gamma_P - S_{11}^P)};$$

$$Z_{LP} = Z_0 \frac{1 + \Gamma_{LP}}{1 - \Gamma_{LP}} V_{LP} = \frac{S_{21}^P (1 + \Gamma_{LP}) V_P}{1 + S_{22}^P - (S_{22}^P + S_{11}^P S_{22}^P - S_{12}^P S_{21}^P) \Gamma_{LP}};$$

$$I_{LP} = \frac{V_{LP}}{Z_{LP}} \Gamma_L = \frac{Z_L - Z_0}{Z_L + Z_0};$$

$$\Gamma_{node} = S_{11}^C + \frac{S_{12}^C S_{21}^C \Gamma_L}{1 - S_{22}^C \Gamma_L};$$

$$Z_{node} = Z_0 \frac{1 + \Gamma_{node}}{1 - \Gamma_{node}}$$

New main and peak branch load impedances $Z_{LM}$, $Z_{LLM}$, and $Z_{LP}$ are calculated using the newly calculated values of $I_{LM}$, $I_{LP}$ as follows:

$$V = (I_{LM} + I_{LP}) Z_{node};$$

$$Z_{LM} = \frac{V}{I_{LM}};$$

$$Z_{LP} = \frac{V}{I_{LP}} Z_{LLM} = \frac{Z_{LM} Z_{LOFF}}{Z_{LM} + Z_{LOFF}};$$

$$\Gamma_{LLM} = \frac{Z_{LLM} - Z_0}{Z_{LLM} + Z_0};$$

New main and peak device side impedances $Z_M$ and $Z_P$ are calculated based on the new main and peak branch load impedances $Z_{LLM}$ and $Z_{LP}$ by transforming these impedances through networks 126 and 136 back to the main and peak device side to obtain new device-side impedances $Z_M$ and $Z_P$, respectively.

$$\Gamma_M = S_{11}^M + \frac{S_{12}^M S_{21}^M \Gamma_{LLM}}{1 - S_{22}^M \Gamma_{LLM}};$$

$$Z_M = Z_0 \frac{1 + \Gamma_M}{1 - \Gamma_M}$$

$$\Gamma_{LP} = \frac{Z_{LP} - Z_0}{Z_{LP} + Z_0};$$

$$\Gamma_P = S_{11}^P + \frac{S_{12}^P S_{21}^P \Gamma_{LP}}{1 - S_{22}^P \Gamma_{LP}};$$

$$Z_P = Z_0 \frac{1 + \Gamma_P}{1 - \Gamma_P}$$

In step 512, it is determined whether the new main and peak amplifier device impedance levels $Z_M^{new}$ and $Z_P^{new}$ sufficiently match the corresponding previous impedance levels $Z_M$ and $Z_P$. In one implementation, this determination is made by determining whether the corresponding values are equal to within a specified threshold level. If the different pairs of impedance levels do not all sufficiently match, then the inner loop is not yet complete and processing continues to step 514, where the main and peak amplifier device impedance levels $Z_M$ and $Z_P$ are updated to be equal to the new values $Z_M^{new}$ and $Z_P^{new}$ determined in step 510. Processing then returns to repeat steps 506-512 using the updated impedance levels.

If step 512 determines that the different pairs of impedance levels do all sufficiently match, then the inner loop is complete for the current input power level $P_{in}$, and processing continues to step 516, which determines whether the number $N_{steps}$ of remaining steps is greater than zero. If the number of steps is greater than zero, then the outer loop is not yet complete, and processing continues to step 518, where the number of steps and the main and peak branch input power levels are decremented for the next iteration of the outer loop. Processing then returns to repeat steps 506-512 for the first iteration of the inner loop for the new outer-loop iteration.

If step 516 determines that the number $N_{steps}$ of steps has reached zero, then the analysis algorithm is complete and processing terminates at step 520.

Note that Doherty amplifiers designed using design technique 400 of FIG. 4 can be analyzed using analysis technique 500 of FIG. 5 and/or using any other suitable analysis technique. Similarly, analysis technique 500 can be used to analyze Doherty amplifiers designed using design technique 400 and/or Doherty amplifiers designed using any other suitable design technique.

Although design technique 400 and analysis technique 500 have been described in the context of two-way Doherty amplifiers, in general those techniques can be extended to apply to N-way Doherty amplifiers having a main amplifier branch and (N−1) peak amplifier branches.

Although design technique 400 and analysis technique 500 have been described in the context of fixed input conditioning, those techniques can be applied to other implementations, such as static adjustable input conditioning and dynamic input conditioning. Static adjustable input conditioning implies that the amplitude ratio of the input signals and their phase relationship are adjusted for one power level at a frequency of interest. The user can specify change of input settings with frequency. Dynamic adjustable input conditioning implies that the amplitude ratio of the input signals and their phase relationship are specified for all power levels and frequencies of interest. The user can specify change of input settings with power and frequency. Each of these three different scenarios has its own set of goals and restrictions, and they can all be addressed using the principles and calculations of design technique 400 and analysis technique 500.

While this invention has been described with reference to illustrative embodiments, this description is not intended to be construed in a limiting sense.

Various modifications of the described embodiments, as well as other embodiments of the invention, which are apparent to persons skilled in the art to which the invention pertains are deemed to lie within the principle and scope of the invention as expressed in the following claims.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The description and drawings merely illustrate the principles of the invention. It will thus be appreciated that those of ordinary skill in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

What is claimed is:

1. A method for analyzing an amplifier having a main amplifier branch and at least one peak amplifier branch, each branch having an active device, the technique comprising:
   (a) specifying an input power level and impedance levels for the amplifier;
   (b) obtaining output power level and phase response of each active device using load-pull data based on the input power level and the impedance levels;
   (c) analyzing performance of the amplifier based on the impedance levels, the output power levels, and the phase responses;
   (d) determining new values for the impedance levels based on the output voltage levels of the active devices; and
   (e) repeating steps (b) and (c) based on the new impedance level values.

2. The method of claim 1, wherein the amplifier is a Doherty amplifier.

3. The method of claim 1, wherein step (c) comprises determining an output voltage level for each active device.

4. The method of claim 1, wherein steps (d) and (e) are repeated until the new impedance level values are substantially equal to corresponding previous impedance level values.

5. The method of claim 1, wherein steps (a)-(c) are repeated for one or more additional input power levels.

6. The method of claim 1, wherein the load-pull data comprises:
   load-pull data for the active devices in the main and peak branches for a high-power operating mode of the amplifier; and
   load-pull data for only the active device in the main branch for a high-efficiency operating mode of the amplifier.

7. The method of claim 1, wherein the load-pull data comprises:
   Class-AB amplifier load-pull data for the active device in the main branch; and
   Class-C amplifier load-pull data for the active device in each peak branch.

8. The method of claim 1, wherein the amplifier is a Doherty amplifier.

9. The method of claim 1, wherein:
   step (c) comprises determining an output voltage level for each active device;
   steps (d) and (e) are repeated until the new impedance level values are substantially equal to corresponding previous impedance level values;
   steps (a)-(c) are repeated for one or more additional input power levels; and
   the load-pull data comprises:
      Class-AB amplifier load-pull data for the active device in the main branch for a high-power operating mode of the amplifier;
      Class-C amplifier load-pull data for the active device in the peak branch for the high-power operating mode of the amplifier; and
      Class-AB amplifier load-pull data for only the active device in the main branch for a high-efficiency operating mode of the amplifier.

10. The method of claim 1, wherein the amplifier is designed based on the load-pull data for the active devices.

11. The method of claim 10, wherein the amplifier is designed by:
   (1) obtaining impedance levels for the amplifier from the load-pull data for the active devices;
   (2) determining a combiner impedance modulation ratio (e.g., Ncomb) for the amplifier;
   (3) determining a main device impedance modulation ratio (e.g., NLP) for the amplifier based on the impedance levels;
   (4) determining whether the combiner impedance modulation ratio and the main device impedance modulation ratio satisfy a specified condition; and
   (5) repeating steps (2)-(4) using adjusted impedance levels until the combiner impedance modulation ratio and the main device impedance modulation ratio satisfy the specified condition to determine final impedance levels for the amplifier.

12. The method of claim 11, wherein the specified condition is the combiner impedance modulation ratio being substantially equal to the main device impedance modulation ratio.

13. The method of claim 11, further comprising:
(6) completing the design of the amplifier based on the final impedance levels.

14. The method of claim 13, wherein step (6) comprises determining S matrices for (i) a main output matching network in the main branch and (ii) a peak output matching network in the peak branch.

15. A method for designing an amplifier having a main amplifier branch and at least one peak amplifier branch, each branch having an active device, the technique comprising:
(1) obtaining impedance levels for the amplifier from the load-pull data for the active devices;
(2) determining a combiner impedance modulation ratio (e.g., Ncomb) for the amplifier;
(3) determining a main device impedance modulation ratio (e.g., NLP) for the amplifier based on the impedance levels;
(4) determining whether the combiner impedance modulation ratio and the main device impedance modulation ratio satisfy a specified condition; and
(5) repeating steps (2)-(4) using adjusted impedance levels until the combiner impedance modulation ratio and the main device impedance modulation ratio satisfy the specified condition to determine final impedance levels for the amplifier.

16. The method of claim 15, wherein the specified condition is the combiner impedance modulation ratio being substantially equal to the main device impedance modulation ratio.

17. The method of claim 15, further comprising:
(6) completing the design of the amplifier based on the final impedance levels.

18. The method of claim 17, wherein step (6) comprises determining S matrices for (i) a main output matching network in the main branch and (ii) a peak output matching network in the peak branch.

19. The amplifier designed using the method of claim 15.

20. A method for analyzing an amplifier having a main amplifier branch and at least one peak amplifier branch, each branch having an active device, the technique comprising:
(a) specifying an input power level and impedance levels for the amplifier;
(b) obtaining output power level and phase response of each active device using load-pull data based on the input power level and the impedance levels, wherein the load-pull data comprises:
load-pull data for the active devices in the main and peak branches for a high-power operating mode of the amplifier; and
load-pull data for only the active device in the main branch for a high-efficiency operating mode of the amplifier; and
(c) analyzing performance of the amplifier based on the impedance levels, the output power levels, and the phase responses.

* * * * *

UNITED STATES PATENT AND TRADEMARK OFFICE
CERTIFICATE OF CORRECTION

PATENT NO.       : 8,975,955 B2                                    Page 1 of 1
APPLICATION NO.  : 13/710605
DATED            : March 10, 2015
INVENTOR(S)      : Igor Acimovic et al.

It is certified that error appears in the above-identified patent and that said Letters Patent is hereby corrected as shown below:

On the Title Page, in Item (54), replace "Analysis Of Doherty Amplifiers" with -- Design And Analysis Of Doherty Amplifiers --.

Signed and Sealed this
Twenty-second Day of December, 2015

Michelle K. Lee
*Director of the United States Patent and Trademark Office*